United States Patent
Weckesser

(10) Patent No.: US 9,732,420 B2
(45) Date of Patent: Aug. 15, 2017

(54) REACTOR FOR PRODUCING POLYCRYSTALLINE SILICON AND METHOD FOR REMOVING A SILICON-CONTAINING LAYER ON A COMPONENT OF SUCH A REACTOR

(71) Applicant: WACKER CHEMIE AG, Munich (DE)

(72) Inventor: Dirk Weckesser, Mehring (DE)

(73) Assignee: Wacker Chemie AG, Munich (DE)

( * ) Notice: Subject to any disclaimer, the term of this patent is extended or adjusted under 35 U.S.C. 154(b) by 0 days.

(21) Appl. No.: 14/891,458

(22) PCT Filed: May 6, 2014

(86) PCT No.: PCT/EP2014/059166
§ 371 (c)(1),
(2) Date: Nov. 16, 2015

(87) PCT Pub. No.: WO2014/184043
PCT Pub. Date: Nov. 20, 2014

(65) Prior Publication Data
US 2016/0115591 A1    Apr. 28, 2016

(30) Foreign Application Priority Data

May 16, 2013    (DE) .................. 10 2013 209 076

(51) Int. Cl.
C23C 14/44    (2006.01)
C23C 16/44    (2006.01)
(Continued)

(52) U.S. Cl.
CPC .......... *C23C 16/4407* (2013.01); *B01D 45/16* (2013.01); *B01D 50/002* (2013.01);
(Continued)

(58) Field of Classification Search
CPC . C23C 16/4407; C23C 16/24; C23C 16/4412; C23C 16/442; B01D 45/16;
(Continued)

(56) References Cited

U.S. PATENT DOCUMENTS 4,500,492 A    2/1985    Yamakawa
4,684,513 A    8/1987    Iya
(Continued)

FOREIGN PATENT DOCUMENTS

EP    2 583 943 A1    4/2013
JP    H026317 A    1/1990
(Continued)

OTHER PUBLICATIONS

Siegried Janke, "untersuchung der Zusammendruckbarkeit und Scherfestigkeit von Sanden und Kiesen sowie der sie bestimmenden Einflusse" (An investigation in the compressibility and shear strength of sands and gravels and in the influences governing them), Karlsruhe: Bundesanstalt fur Wasserbau, 1969, Mitteilungsblatt der Bundesanstalt fur Wasserbau, 28.

*Primary Examiner* — Duy Deo
(74) *Attorney, Agent, or Firm* — Brooks Kushman P.C.

(57) ABSTRACT

Silicon deposited by CVD and/or silico dust is removed from a polycrystalline silicon deposition reactor component by abrasion with silicon-containing particles in a gas stream.

14 Claims, 2 Drawing Sheets

(51) Int. Cl.

| | | |
|---|---|---|
| *C01B 33/035* | (2006.01) | |
| *C23C 16/24* | (2006.01) | |
| *C23C 16/442* | (2006.01) | |
| *B24C 1/08* | (2006.01) | |
| *B24C 11/00* | (2006.01) | |
| *C01B 33/027* | (2006.01) | |
| *B01D 45/16* | (2006.01) | |
| *B01D 50/00* | (2006.01) | |

(52) U.S. Cl.
CPC .............. *B24C 1/086* (2013.01); *B24C 11/00* (2013.01); *C01B 33/027* (2013.01); *C01B 33/035* (2013.01); *C23C 16/24* (2013.01); *C23C 16/442* (2013.01); *C23C 16/4412* (2013.01)

(58) Field of Classification Search
CPC ....... B01D 50/002; B24C 1/086; B24C 11/00; C01B 33/027; C01B 33/035
See application file for complete search history.

(56) References Cited

U.S. PATENT DOCUMENTS

| | | | |
|---|---|---|---|
| 4,786,477 A | 11/1988 | Yoon et al. | |
| 4,805,556 A | 2/1989 | Hagan et al. | |
| 5,108,512 A | 4/1992 | Goffnett et al. | |
| 5,358,603 A | 10/1994 | Ibrahim et al. | |
| 5,798,137 A | 8/1998 | Lord et al. | |
| 7,922,990 B2 | 4/2011 | Hertlein et al. | |
| 2002/0006766 A1 | 1/2002 | Haerle et al. | |
| 2002/0081250 A1 | 6/2002 | Lord | |
| 2002/0102850 A1 | 8/2002 | Kim et al. | |
| 2003/0026917 A1* | 2/2003 | Lin ................... | H01J 37/32458 427/453 |
| 2003/0221708 A1 | 12/2003 | Ly et al. | |
| 2006/0089258 A1 | 4/2006 | Hinman et al. | |
| 2008/0056979 A1 | 3/2008 | Arvidson et al. | |
| 2008/0078326 A1* | 4/2008 | Sung ..................... | C23C 14/021 118/723 R |
| 2008/0299291 A1 | 12/2008 | Weidhaus et al. | |
| 2009/0095710 A1* | 4/2009 | Kim ...................... | C01B 33/027 216/37 |
| 2013/0323914 A1* | 12/2013 | Liao .................. | H01L 21/02532 438/482 |

FOREIGN PATENT DOCUMENTS

| | | |
|---|---|---|
| JP | H06216036 A | 8/1994 |
| JP | H09272979 A | 10/1997 |
| JP | H11510560 A | 9/1999 |
| JP | 2004505445 A | 2/2004 |
| JP | 2010502542 A | 1/2010 |
| JP | 2012101984 A | 5/2012 |
| JP | 2014002224 A | 1/2014 |
| WO | 01/25167 A1 | 4/2001 |
| WO | 2008/022348 A2 | 2/2008 |
| WO | 2012/008112 A1 | 1/2012 |

* cited by examiner

REACTOR FOR PRODUCING POLYCRYSTALLINE SILICON AND METHOD FOR REMOVING A SILICON-CONTAINING LAYER ON A COMPONENT OF SUCH A REACTOR

CROSS REFERENCE TO RELATED APPLICATIONS

This application is the U.S. National Phase of PCT Appln. No. PCT/EP2014/059166 filed May 6, 2014, which claims priority to German Application No. 10 2013 209 076.5 filed May 16, 2013, the disclosures of which are incorporated in their entirety by reference herein.

BACKGROUND OF THE INVENTION

1. Field of the Invention

The invention relates to a reactor for producing polycrystalline silicon and also to a method for removing a silicon-containing deposit on a component of such a reactor.

2. Description of the Related Art

Polycrystalline silicon (polysilicon for short) serves as a starting material for producing monocrystalline silicon for semiconductors by the Czochralski (CZ) or zone melting (FZ) process, and also for producing monocrystalline or multicrystalline silicon by means of various pulling and casting methods for producing solar cells for photovoltaics.

Polycrystalline silicon is generally produced by means of the Siemens process. In this process, in a bell-shaped reactor ("Siemens reactor"), substrates, usually thin filament rods (thin rods) of silicon, are heated by direct passage of current and a reaction gas containing hydrogen and one or more silicon-containing components is introduced.

Usually, as a silicon-containing component, trichlorosilane ($SiHCl_3$, TCS) or a mixture of trichlorosilane with dichlorosilane ($SiH_2Cl_2$, DCS) and/or with tetrachlorosilane ($SiCl_4$, STC) is used. The use of monosilane ($SiH_4$) is also known.

The thin rods are usually embedded vertically in electrodes situated on the reactor base which provide the connection to the power supply. In each case two thin rods are coupled via a horizontal bridge (likewise made of silicon) and form a substrate for the silicon deposition. Owing to the bridge coupling, the typical U shape of the substrates is generated.

High-purity polysilicon is deposited on the heated thin rods and the horizontal bridge, as a result of which the diameter thereof grows with time.

Polycrystalline silicon granules, or polysilicon granules for short, are an alternative to the polysilicon produced in the Siemens process. Whereas the polysilicon in the Siemens process is produced as a cylindrical silicon rod, which, before further processing thereof, must be comminuted in a time-consuming and costly manner to form what is termed "chip poly" and may need to be purified again, polysilicon granules have bulk product properties and can be used directly as a raw material, e.g. for monocrystal generation for the photovoltaics and electronics industries.

Polysilicon granules are produced in a fluidized-bed reactor. This proceeds by fluidization of silicon particles by means of a gas flow in a fluidized bed, wherein the fluidized bed is heated to high temperatures via a heating device. By addition of a silicon-containing reaction gas, a pyrolysis reaction proceeds on the hot particle surfaces. In this process, elemental silicon is deposited on the silicon particles and the individual particles grow in diameter. By means of regular takeoff of particles that have grown and addition of smaller silicon particles as seed particles ("seed"), the method can be operated continuously with all of the associated advantages. Such deposition processes and devices therefore are known, for example, from U.S. Pat. No. 4,786,477 A.

It has been found that in these processes, silicon deposition occurs on the hot reactor parts, e.g. the reactor wall, internal parts and nozzles. Firstly, this concerns silicon deposited on the reactor parts. Secondly, this concerns silicon dust which grows on hot reactor parts.

US 20020102850 A1 discloses a method for avoiding or removing silicon deposition on reactant gas nozzles by continuous, discontinuous or controlled addition of HCl+ inert gas ($H_2$, $N_2$, He, Ar) or inert gas $H_2$.

US 20020081250 A1 describes a method in which separation or partial removal of the wall deposit by etching proceeds at operating temperature or close to the operating temperature of the fluidized-bed reactor using a halogen-containing gaseous etchant, such as hydrogen chloride, chlorine gas or silicon tetrachloride. However, such a process procedure is associated with increased operating costs.

U.S. Pat. No. 7,922,990 B2 claims a method in which, in a reactor having a hot surface, a reaction gas containing a gaseous silicon compound is deposited at a reaction temperature of 600 to 1100° C. as silicon metal on silicon particles which are fluidized in a fluidized bed by means of a fluidizing gas and are heated to the reaction temperature, and the particles furnished with the deposited silicon and also unreacted reaction gas and fluidizing gas are removed from the reactor, characterized in that on the surface of the reactor, a gas composition containing 99.5 to 95 mol % hydrogen and 0.5 to 5 mol % of the gaseous silicon compound is present, and the surface of the reactor has a temperature of 700 to 1400 degrees C., this temperature corresponding to the temperature of the silicon particles or being higher than the temperature of the silicon particles.

Via the combination of a high reactor surface temperature with a gas composition containing 99.5 to 95 mol % hydrogen and 0.5 to 5 mol % of the gaseous silicon compound, a reaction equilibrium may be established on the reactor surface, in which deposition of silicon onto the surface of the reactor virtually no longer takes place, and therefore a continuous process procedure is possible.

US 2008299291 A1 discloses how, by suitable choice of the process parameters of the the mean gas velocity in the two fluidized zones of the fluidized bed, the local gas velocities of the gases or gas mixtures at the exit of the nozzle systems, the pressure and the temperature of the fluidized bed, the placing of the nozzles relative to one another and relative to the fluidized bed containing wall and the residence time of the gases in the fluidized zones of the fluidized bed, a reaction course and therefore a concentration profile can be generated which ensures that the reaction gas is reacted to virtually the chemical equilibrium conversion rate before it reaches either the fluidized bed containing wall or the fluidized bed surface. As a result, wall deposition on the fluidized bed containing wall is reduced to a very low extent, which permits the unimpeded heating of the fluidized bed in the region of the reaction zone over a long period.

By the previously described processes, the silicon deposition on the reactor wall appears to be reducible by a suitable process procedure. However, this does not apply to deposits on other internal parts in the reactor or in the vicinity of the reactor, such as product takeoff tubes or off-gas tubes. In particular, this applies when the deposit consists of Si dust, which is discharged from the fluidized bed. Here also, in the prior art, removal of the wall deposit by etching is recommended.

U.S. Pat. No. 5,358,603 A discloses a method for etching a silicon deposit on a product takeoff tube, wherein the reactor is shut down, and the silicon deposit is heated and then etched using a mineral acid such as HCl. Primarily, the necessity to shut down the reactor makes this method complex and uneconomical. In addition, the operating media costs increase.

A particular problem is the fact that during relatively long operation of a fluidized-bed reactor, owing to deposit formation, the heat transfer in the off-gas heat exchanger is impaired. The off-gas can no longer be sufficiently cooled. In CVD Siemens reactors and the off-gas (Liebig) tubes thereof, those skilled in the art are also confronted with similar problems.

The problems described yielded the objective of the invention.

SUMMARY OF THE INVENTION

The invention is directed to a method for removing a silicon-containing deposit on a component of a reactor in which polycrystalline silicon is produced, which comprises removing the deposit mechanically by means of silicon-containing particles.

DETAILED DESCRIPTION OF THE DRAWINGS

DETAILED DESCRIPTION OF THE PREFERRED EMBODIMENTS

Figure 1:
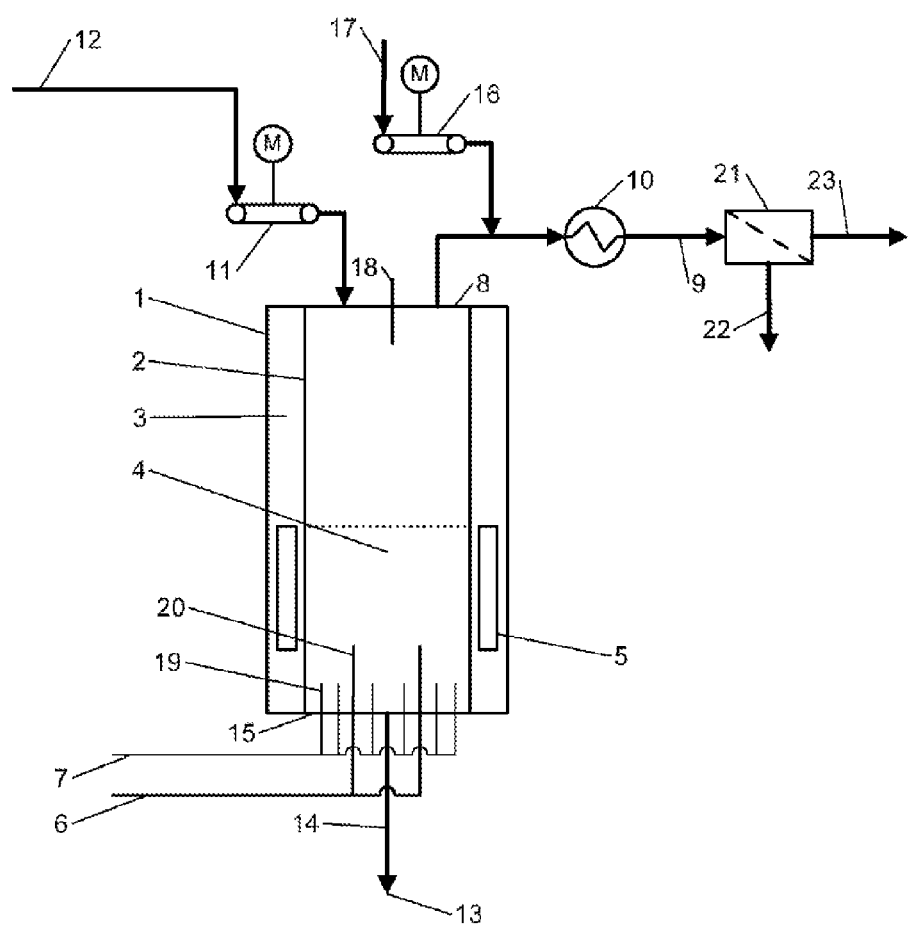
FIG. 1 shows schematically a preferred embodiment of the fluidized-bed reactor used in the context of the invention.

Preferably, the silicon-containing particles have a median particle size of 1 µm<$x_{50.3}$<400 µm, more preferably 30 µm<$x_{50.3}$<300 µm. Preferably, they are sharp-edged particles. It has been found that removing the wall deposit proceeds particularly effectively thereby.

The international standard of the "Federation Europeenne de la Manutention", in FEM 2581, gives an overview of under which aspects a bulk product should be considered. In the standard FEM 2582, the general and specific bulk product properties are defined with respect to classification. Characteristics which describe the consistency and state of the product are, for example, grain shape and grain size distribution (FEM 2.581/FEM 2.582: General characteristics of bulk products with regard to their classification and their symbolization).

Also, according to DIN ISO 3435, bulk products can be subdivided into 6 different grain shapes, depending on the properties of the grain edges:

I Sharp edges having roughly equal extents in three dimensions (exp.: cubes)

II Sharp edges, among which one is notably longer than the other two (exp.: prism, blade)

III Sharp edges, among which one is notably smaller than the others (exp.: panel, scales)

IV Round edges having roughly equal extents in three dimensions (exp.: sphere)

V Fibrous, threadlike, curly, entwined

According to this classification of bulk products the silicon-containing particles for removing the wall deposit are preferably particles of grain shapes I, II and III. The particles preferably have a sphericity of less than 0.9. More preferably, the particles have a sphericity of less than 0.8.

The sphericity is determined via dynamic image analysis according to the standard ISO/DIS 13322-2.

Sphericity is defined as follows:

$$Sph = \frac{4 \cdot \pi \cdot A}{U^2},$$

having the area of projection A and the projected circumference U of the particle.

A further characteristic of the angularity of the particles is what is termed the degree of roughness according to Jänke (Siegfried Jänke, Untersuchung der Zusammendrückbarkeit und Scherfestigkeit von Sanden und Kiesen sowie der sie bestimmenden Einflüsse=An investigation in the compressibility and shear strength of sands and gravels and in the influences governing them, Karlsruhe: Federal Waterways Engineering and Research Institute, 1969, Mitteilungsblatt der Bundesanstalt für Wasserbau, 28). The particles, according to this definition, preferably have a degree of roughness of greater than 0.6.

Preferably, an etching gas is admixed for removal of the deposit. As an etching gas, for example, HCl is suitable.

The deposit is preferably removed in situ. The reactor is therefore preferably in operation and is not shut down in order to remove the deposit.

Preferably, an off-gas heat exchanger of a reactor is freed from the deposit. These are used both in fluidized-bed reactors and in CVD Siemens reactors.

The off-gas heat exchanger is preferably a Liebig tube. In this case this is a tube open at both ends which is surrounded by a larger tube. The cooling water flows between the inner and outer tubes and the off-gas flows in the inner tube.

It is equally preferred to use a jacketed tube, plate, tube bundle, layer or spiral heat exchanger or a cooling battery.

The reactor is preferably a CVD reactor for depositing polycrystalline silicon on filament rods.

The reactor is also, preferably, a fluidized-bed reactor for producing polycrystalline silicon granules by deposition of polycrystalline silicon on silicon seed particles added to the reactor.

In the case of a fluidized-bed reactor for producing granules, the silicon-containing particles are preferably added to the seed particles (seed) and in this case continuously fed to the reactor.

The median diameter of the seed particles is preferably at least 400 µm.

Likewise, the silicon-containing particles can be fed to the reactor separately in situ.

Preferably, the silicon-containing particles are fed separately to the reactor in situ, wherein they, after the cooling, are cyclically or continuously separated from the off-gas by a cyclone or a surface filter and then returned to the off-gas heat exchanger directly after the entry of the dusty reactor off-gas.

The silicon-containing particles in the simplest case are pure silicon particles. Silicon particles having the required particle sizes can be provided by milling high-purity silicon, e.g. polycrystalline silicon granules, and subsequent sifting. However, the use of SiC particles is also preferred. The use of $SiO_2$ particles is just as preferred. In this case, the particles can be particles from the combustion of silicon tetrachloride to form highly dispersed silica.

Preferably, the off-gas heat exchanger is operated in cocurrent, countercurrent or cross-flow mode.

In this case the parameters particle size, velocity and particle shape of the cleaning particles and the loading of the off-gas stream with cleaning particles play a decisive role.

By adding a defined mass stream of particles having a defined particle size and particle shape, at a defined gas velocity, the formation of wall deposits is surprisingly suppressed and thus the cooling action and proper operation of the fluidized-bed reactor are made possible for the first time.

The median seed mass stream is between 0.5 and 15 kg/h. The fine fraction of sharp-edged, abrasive particles in the seed mass stream ranges between 1 and 30% by weight. The superficial gas velocity in the expansion head of the fluidized-bed reactor is between 0.01 and 10 m/s, preferably between 0.1 and 1 m/s. In the Liebig tube, a gas velocity of between 10 and 1000 m/s develops.

The substantial advantages of the method according to the invention are that the removal of the wall deposit proceeds continuously during the deposition process.

In the Liebig tube, removing the deposit ensures that sufficient cooling of the off-gas proceeds.

The removal of the deposit proceeds without contamination by means of additional substances.

The off-gas can be cooled down for the subsequent off-gas filtration. Technically complex and costly hot filtration is not necessary.

No further structural measures are required when the particles with the seed mass stream are fed via the seed metering channel and are discharged from the process with the off-gas dust via the conventional cold filtration.

The invention also relates to a reactor for producing polycrystalline silicon, comprising a reactor vessel (1), a multiplicity of substrates of silicon within the reactor vessel (1) suitable for depositing polycrystalline silicon thereon, one or more nozzles (19, 20) in order to feed reaction gas to the reactor vessel (1), an appliance for removing reactor off-gas (9) from the reactor vessel (1), an off-gas heat exchanger (10) for cooling the reactor off-gas that is removed and also a feed appliance (16) for silicon-containing particles suitable for feeding reactor off-gas and silicon-containing particles to the off-gas heat exchanger (10).

Preferably, the reactor is a CVD reactor for producing polycrystalline silicon in rod form and the substrates are filament rods of silicon, wherein a power supply for the filament rods is present, suitable for heating the filament rods by direct passage of current.

It is particularly preferred when the reactor is a fluidized-bed reactor for producing granular polysilicon and the substrates are silicon seed particles, comprising an inner reactor tube (2) for a fluidized bed having granular polysilicon and a reactor base within the reactor vessel (1), a heating device (5) for heating the fluidized bed in the inner reactor tube (2), at least one bottom gas nozzle (19) for feeding fluidizing gas, and at least one reaction gas nozzle (20) for feeding reaction gas, a feed appliance (11) for feeding silicon seed particles, and a take-off conduit (14) for granular polysilicon.

Preferably, the fluidized-bed reactor additionally comprises a filter (21) connected downstream of the off-gas heat exchanger (10) and suitable for separating particles and gas.

Preferably, the fluidized-bed reactor additionally comprises a cyclone (24) connected downstream of the off-gas heat exchanger (10) for continuous separation of particles from the reactor off-gas and which is communicatively connected to a feed appliance (16) for silicon-containing particles. Preferably, the fluidized-bed reactor additionally comprises a filter (26) connected downstream of the cyclone (24) for separating off reactor off-gas dust (27).

EXAMPLE

The example hereinafter relates to a fluidized-bed reactor.

In a method for deposition of polysilicon granules at a deposition rate of 10 kg/h, the mean seed metering rate was 1.5 kg/h. Sharp-edged silicon particles were present at 18% by weight in the seed mass stream. These abrasive particles had a median particle size of $x_{50,3}=125$ μm, a sphericity of 0.55 and a degree of roughness of 0.74. The sharp-edged particles were discharged from the reactor with the off-gas stream, owing to the superficial gas velocity in the expansion head of the fluidized-bed reactor of 0.4 m/s, and continuously removed the silicon-containing deposit in the off-gas heat exchanger. The gas velocity in the Liebig tube was 70 m/s. The off-gas heat exchanger cooled the off-gas from 700° C. to 100° C.

The device used for carrying out the method is explained hereinafter with reference to FIGS. 1 and 2.

LIST OF REFERENCE SIGNS

1 Reactor vessel
2 Inner reactor tube
3 Intermediate space
4 Fluidized bed
5 Heating device
6 Reaction gas mixture
7 Fluidizing gas
8 Reactor head
9 Reactor off-gas
10 Off-gas heat exchanger
11 Seed feed appliance
12 Seed
13 Product (polysilicon granules)
14 Take-off conduit
15 Reactor base
16 Feed appliance
17 Cleaning particles
18 Pyrometer
19 Bottom gas nozzles
20 Reaction gas nozzles
21 Filter
22 Particle stream
23 Particle-free gas stream
24 Cyclone
25 Silicon-containing particles (cleaning particles)
26 Filter
27 Reactor off-gas dust The fluidized-bed reactor consists of a reactor vessel 1, into which an inner reactor tube 2 is inserted.

Between the inner wall of the reactor and the outer wall of the inner tube is situated an intermediate space 3.

In the interior of the reactor tube there is situated the fluidized bed 4 with the polysilicon granules.

The fluidized bed is heated by means of a heating device 5.

As feed gases, the fluidizing gas 7 and the reaction gas mixture 6 are fed to the reactor.

The gas feed proceeds in this case in a specific manner via nozzles.

The fluidizing gas 7 is fed via bottom gas nozzles 19 and the reaction gas mixture is fed via what are termed secondary gas nozzles (reaction gas nozzles) 20. The height of the secondary gas nozzles can differ from the height of the bottom gas nozzles.

In the reactor, owing to the arrangement of the nozzles, a bubbling fluidized bed with additional vertical secondary gas injection is formed.

At the reactor head 8, a pyrometer 18 is mounted for measuring the fluidized-bed temperature.

Seed 12 is fed to the reactor at the reactor head via a seed feed appliance 11.

The polysilicon granule product 13 is taken off at the reactor base 15 via a take-off conduit 14.

At the reactor head 8, the reactor off-gas 9 is taken off and fed to the off-gas heat exchanger 10.

Upstream of the off-gas heat exchanger, silicon-containing particles 17 are fed by means of a feed appliance 16 to the off-gas stream.

The now cold off-gas is fed via a filter 21 downstream of the off-gas heat exchanger 10.

The filter 21 separates a particle stream 22, which consists of reactor off-gas dust and the particles 17 fed for the cleaning, from the particle-free gas stream 23.

FIG. 1 shows a simplified diagram without recirculation of the particles used for the cleaning. The particles in this case are separated from the gas stream via the off-gas dust filter.

Figure 2:
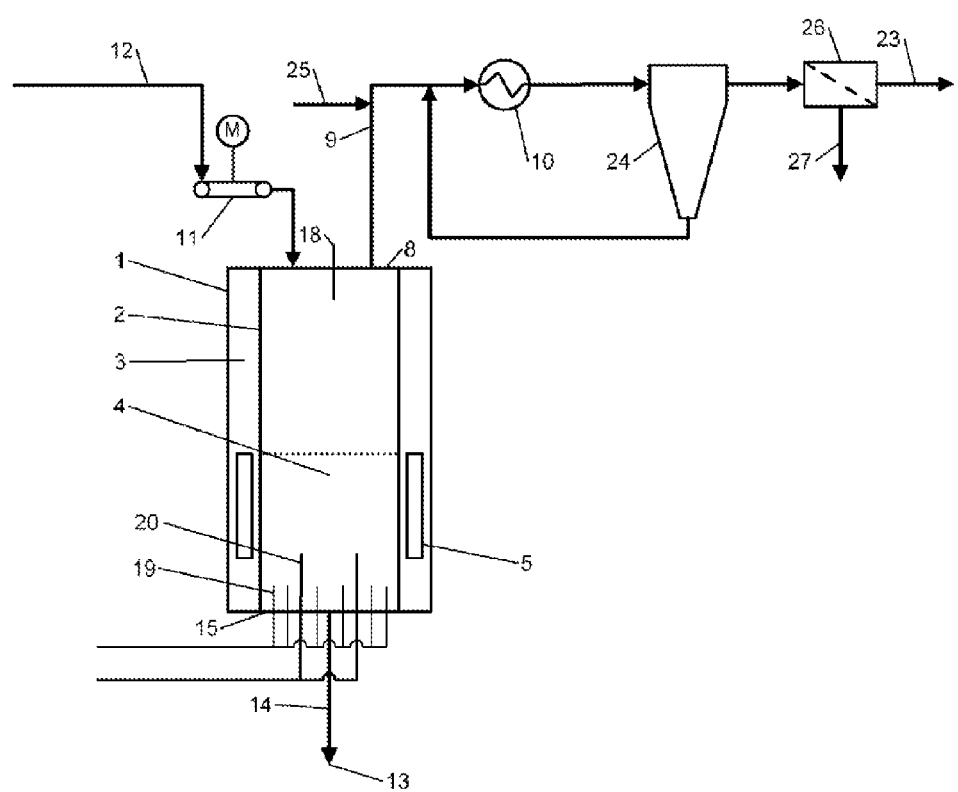
FIG. 2 shows schematically a further preferred embodiment of the fluidized-bed reactor used in the context of the invention.

A further preferred embodiment is shown in FIG. 2, which is an extension of the foregoing apparatus by a cyclone 24 which continuously removes the particles used for the cleaning from the off-gas stream 9 and returns them to the off-gas heat exchanger 10 directly downstream of the entry of the dusty reactor off-gas.

The silicon-containing particles 25 are added once to the system.

Downstream of the cyclone 24 the off-gas stream 9 loaded with reactor off-gas dust passes through a filter 26 in which the reactor off-gas dust 27 is separated off from the particle-free gas stream 23.

The invention claimed is:

1. A method for removing a silicon-containing deposit on a component of a reactor in which polycrystalline silicon is produced, which comprises removing the deposit mechanically by means of abrasion by silicon-containing particles, wherein the deposit is removed while the reactor is in operation while polycrystalline silicon is being produced.

2. The method of claim 1, wherein the component of the reactor on which the deposit is removed comprises an off-gas tube.

3. The method of claim 2, wherein the off-gas tube further comprises an off-gas heat exchanger.

4. The method of claim 3, wherein the off-gas heat exchanger comprises a Liebig tube.

5. The method of claim 1, wherein the reactor is a CVD reactor for depositing polycrystalline silicon on filament rods.

6. The method of claim 1, wherein the reactor is a fluidized-bed reactor for producing polycrystalline silicon granules by deposition of polycrystalline silicon on silicon seed particles added to the reactor.

7. The method of claim 5, wherein the silicon-containing particles are added to seed particles and continuously fed to the fluidized-bed reactor.

8. The method of claim 5, wherein the silicon-containing particles are fed to the fluidized-bed reactor separately without admixture of other substances.

9. The method of claim 6, wherein the silicon-containing particles, after cooling in an off-gas heat exchanger, are cyclically or continuously separated from the off-gas by a cyclone or a surface filter and then returned to the off-gas heat exchanger directly after entry of a dusty reactor off-gas.

10. The method of claim 1, wherein the silicon-containing particles for removing the deposit have a median particle size of 1 µm<$x_{50.3}$<400 µm.

11. The method of claim 1, wherein the silicon-containing particles for removing the deposit have a median particle size of 30 µm<$x_{50.3}$<300 µm.

12. The method of claim 1, wherein the silicon-containing particles for removing the deposit are pure silicon, SiC, or $SiO_2$.

13. The method of claim 1, wherein the silicon-containing particles are sharp-edged particles.

14. The method of claim 1, wherein an etching gas is used with the silicon-containing particles for removing the deposit.

* * * * *